(12) United States Patent
Shin

(10) Patent No.: US 8,859,309 B2
(45) Date of Patent: Oct. 14, 2014

(54) ORGANIC LIGHT EMITTING DIODE AND METHOD OF FABRICATING THE SAME

(71) Applicant: Electronics and Telecommunications Research Institute, Daejeon (KR)

(72) Inventor: Jin Wook Shin, Incheon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/025,396

(22) Filed: Sep. 12, 2013

(65) Prior Publication Data

US 2014/0017832 A1 Jan. 16, 2014

Related U.S. Application Data

(62) Division of application No. 13/481,999, filed on May 29, 2012, now abandoned.

(30) Foreign Application Priority Data

May 31, 2011 (KR) .......................... 10-2011-0052143
Aug. 1, 2011 (KR) .......................... 10-2011-0076738

(51) Int. Cl.
*H01L 21/00* (2006.01)
*H01L 51/00* (2006.01)
*H01L 51/56* (2006.01)
*H01L 51/52* (2006.01)

(52) U.S. Cl.
CPC .............. *H01L 51/56* (2013.01); *Y02E 10/549* (2013.01); *H01L 51/0096* (2013.01); *H01L 51/5268* (2013.01)
USPC .................................... 438/29; 257/E51.019

(58) Field of Classification Search
CPC ....................................................... H01L 51/56
USPC ..................................... 438/29; 257/E51.019
See application file for complete search history.

(56) References Cited

U.S. PATENT DOCUMENTS

| 7,750,559 | B2 | 7/2010 | Furugori |
| 7,750,564 | B2 | 7/2010 | Lee et al. |
| 2004/0241421 | A1 | 12/2004 | Ootsuka et al. |
| 2004/0263061 | A1 | 12/2004 | Ishikawa et al. |
| 2006/0071233 | A1 | 4/2006 | Cho et al. |
| 2007/0120136 | A1 | 5/2007 | Noda et al. |
| 2007/0257608 | A1 | 11/2007 | Tyan et al. |
| 2011/0168976 | A1 | 7/2011 | Mao |
| 2011/0266577 | A1 | 11/2011 | Kim et al. |
| 2013/0056711 | A1 | 3/2013 | Huh et al. |

FOREIGN PATENT DOCUMENTS

| KR | 10-2004-0030888 A | 4/2004 |
| KR | 10-2005-0001364 A | 1/2005 |
| KR | 10-2005-0121691 A | 12/2005 |
| KR | 10-2008-0020509 A | 3/2008 |
| KR | 10-2008-0050899 A | 6/2008 |
| KR | 10-2010-0078354 A | 7/2010 |
| KR | 10-2011-0062236 A | 6/2011 |

*Primary Examiner* — David S Blum
(74) *Attorney, Agent, or Firm* — Rabin & Berdo, P.C.

(57) ABSTRACT

Provided are an organic light emitting diode and a method of fabricating the same. The organic light emitting diode may include a light-scattering layer, a first electrode, an organic light-emitting layer, and a second electrode, which are sequentially stacked on a substrate, wherein the light-scattering layer may include uneven shaped nanostructures having irregular width and spacing. The method of fabricating the organic light emitting diode may include sequentially stacking a light-scattering medium layer and a metal alloy layer on a substrate, heat treating the metal alloy layer to form etching mask patterns, etching the light-scattering medium layer by using the etching mask patterns to form a light-scattering layer, removing the etching mask patterns, and forming a planarizing layer on the light-scattering layer.

14 Claims, 5 Drawing Sheets

ORGANIC LIGHT EMITTING DIODE AND METHOD OF FABRICATING THE SAME

CROSS-REFERENCE TO RELATED APPLICATIONS

This is a divisional of co-pending U.S. application Ser. No. 13/481,999, filed May 29, 2012. This U.S. non-provisional patent application claims priority under 35 U.S.C. §119 of Korean Patent Applications Nos. 10-2011-0052143, filed on May 31, 2011, and 10-2011-0076738, filed on Aug. 1, 2011, the entire contents of which are hereby incorporated by reference.

BACKGROUND

The present invention disclosed herein relates to an organic light emitting diode, and more particularly, to an organic light emitting diode and a method of fabricating the same.

An organic light emitting diode (OLED) is a self light-emitting device, in which an organic light-emitting material is electrically excited to emit light. The organic light emitting diode includes a substrate, a first electrode, a second electrode, and an organic light-emitting layer disposed between the first electrode and the second electrode. Holes and electrons supplied from the first and second electrodes are combined in the organic light-emitting layer to generate light emitted outside. The organic light emitting diode may emit various colors according to the type of material constituting the organic light-emitting layer. In addition, the organic light emitting diode has excellent display characteristics such as wide viewing angle, fast response speed, thin thickness, low manufacturing costs, and high contrast.

Therefore, the organic light emitting diode is on the spot light as next-generation flat panel display device and lamp. However, a typical organic light emitting diode may have a very low out-coupling efficiency of 20% or less.

SUMMARY

The present invention provides a method of fabricating an organic light emitting diode having improved light extraction efficiency.

Embodiments of the present invention provide organic light emitting diodes including: a substrate; a light-scattering layer including uneven shaped nanostructures formed on the substrate; a first electrode on the light-scattering layer; an organic light-emitting layer on the first electrode; and a second electrode on the organic light-emitting layer.

In some embodiments, a width of the nanostructures may be in a range of about 100 nm to about 1000 nm, a spacing between the nanostructures may be in a range of about 100 nm to about 3000 nm, and the nanostructures may have irregular width and spacing. The nanostructures may have rectangular cross sections or round concave cross sections. The organic light emitting diode may further include a planarizing layer between the light-scattering layer and the first electrode, and the planarizing layer may have a refractive index different from that of the light-scattering layer.

In other embodiments of the present invention, methods of fabricating an organic light emitting diode may include: sequentially stacking a light-scattering medium layer and a metal alloy layer on a substrate; heat treating the metal alloy layer to form etching mask patterns; etching the light-scattering medium layer by using the etching mask patterns to form a light-scattering layer; and removing the etching mask patterns.

In some embodiments, the light-scattering medium layer may include at least one of $SiO_2$, $SnO_2$, $TiO_2$, $TiO_2$-$SiO_2$, $ZrO_2$, $Al_2O_3$, $HfO_2$, $In_2O_3$, indium tin oxide (ITO), metal nitride, a polyethylene-based resin, a polyacryl-based resin, a polyvinyl chloride (PVC) resin, polyvinylpyrrolidone (PVP), a polyimide-based resin, a polystyrene-based resin, or an epoxy-based resin. For example, the light-scattering medium layer may have a refractive index higher than that of the substrate. The light-scattering medium layer may have a refractive index lower than that of the substrate. The light-scattering medium layer may have a thickness ranging from about 50 nm to about 1000 nm.

In other embodiments, the metal alloy layer may include silver (Ag), gold (Au), copper (Cu), platinum (Pt), nickel (Ni), chromium (Cr), palladium (Pd), magnesium (Mg), cesium (Cs), calcium (Ca), tin (Sn), antimony (Sb), lead (Pb), or a combination thereof, and may have a thickness ranging from about 5 nm to about 300 nm.

In still other embodiments, a width of the etching mask patterns may be in a range of about 50 nm to about 1000 nm and a spacing between the etching mask patterns may be in a range of about 100 nm to about 3000 nm.

In even other embodiments, the forming of the light-scattering layer includes dry etching or wet etching the light-scattering medium layer, wherein the dry etching may include reactive ion etching (RIE) or inductively coupled plasma (ICP) etching and the wet etching may include hydrofluoric acid or buffered oxide etchant (BOE) etching.

In yet other embodiments, the light-scattering layer includes nanostructures having an irregular uneven shape, wherein a width of the nanostructures may be in a range of about 100 nm to about 1000 nm and a spacing between the nanostructures may be in a range of about 100 nm to about 3000 nm In further embodiments, the method further includes forming a planarizing layer on the light-scattering layer, wherein the planarizing layer may have a refractive index different from that of the light-scattering layer and may have a refractive index equal to or higher than that of the first electrode.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
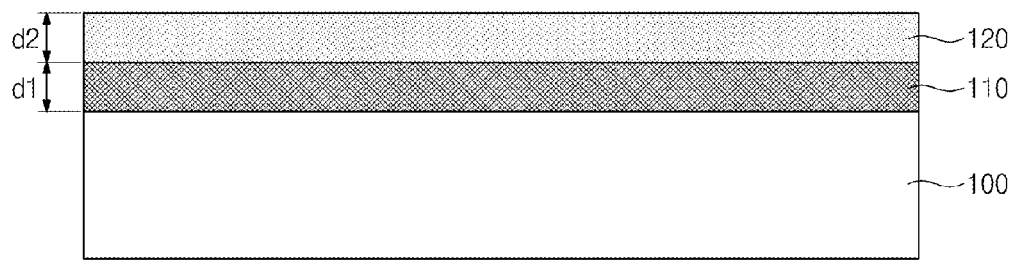
FIGS. 1 through 5 are cross-sectional views illustrating a structure of an organic light emitting diode according to an embodiment of the present invention and a method of fabricating the same.

The above objects, other objects, features and advantages of the present invention will be better understood from the following description of preferred embodiments taken in conjunction with the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

FIGS. 1 through 5 are cross-sectional views illustrating a structure of an organic light emitting diode according to an embodiment of the present invention and a method of fabricating the same.

Referring to FIG. 1, a light-scattering medium layer 110 for forming a light-scattering layer and a metal alloy layer 120 for forming an etching mask on the light-scattering medium layer 110 are sequentially disposed on an upper surface of a substrate 100.

The substrate 100 may include at least one transparent material. For example, the substrate 100 may include at least one of glass, quartz, or transparent plastics.

The light-scattering medium layer 110 may be used as a light-scattering layer. The light-scattering medium layer 110 may have a refractive index higher than that of the substrate 100. Alternatively, the light-scattering medium layer 110 may have a refractive index lower than that of the substrate 100. The light-scattering medium layer 110 may include at least one transparent material. For example, the light-scattering medium layer 110 may include at least one of oxides, such as $SiO_2$, $SnO_2$, $TiO_2$, $TiO_2$-$SiO_2$, $ZrO_2$, $Al_2O_3$, $HfO_2$, $In_2O_3$, and indium tin oxide (ITO), nitrides such as SiNx, or resins, such as a polyethylene-based resin, a polyacryl-based resin, polyvinyl chloride (PVC), polyvinylpyrrolidone (PVP), a polyimide-based resin, a polystyrene-based resin, and an epoxy-based resin.

The light-scattering medium layer 110 may have an etch selectivity with respect to the substrate 100. Since the light-scattering medium layer 110 has an etch selectivity with respect to the substrate 100, nanostructures of the light-scattering layer formed in the light-scattering medium layer 110 may be formed to have a desired ratio of width and height. (see 115 of FIG. 4)

The light-scattering medium layer 110 may be formed by sputter deposition, chemical vapor deposition (CVD), E-beam evaporation, thermal evaporation, or atomic layer deposition (ALD). The light-scattering medium layer 110 may be formed to a desired thickness d1 by using the foregoing deposition methods and for example, may be formed in a thickness d1 range of about 50 nm to about 1000 nm.

The metal alloy layer 120 may be used as an etching mask pattern. The metal alloy layer 120 may be an alloy including silver (Ag), gold (Au), copper (Cu), platinum (Pt), nickel (Ni), chromium (Cr), palladium (Pd), magnesium (Mg), cesium (Cs), calcium (Ca), tin (Sn), antimony (Sb), lead (Pb), or a combination thereof.

The metal alloy layer 120 may be formed by sputter deposition, chemical vapor deposition, E-beam evaporation, thermal evaporation, or atomic layer deposition. The metal alloy layer 120 may be formed to a desired thickness d2 by using the foregoing deposition methods and for example, may be formed in a thickness d2 range of about 5 nm to about 300 nm.

Surface energy of the metal alloy layer 120 may be higher than that of the light-scattering medium layer 110 and a melting point of the metal alloy layer 120 may be lower than softening points of the substrate 100 and the light-scattering medium layer 110. The metal alloy layer 120 may have a high etch selectivity with respect to the light-scattering medium layer 110.

Figure 2:
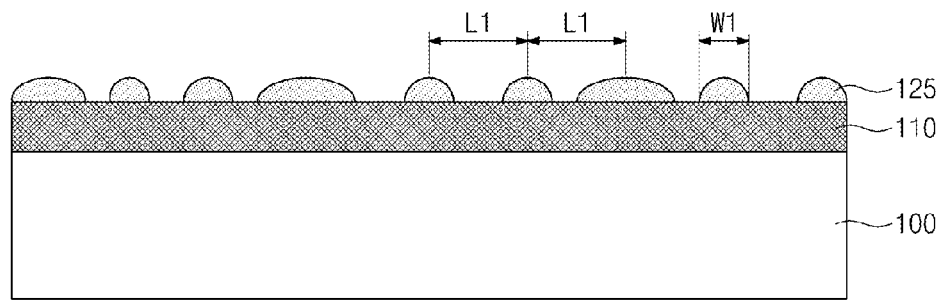

Referring to FIG. 2, etching mask patterns 125 are formed on the light-scattering medium layer 110.

The etching mask patterns 125 may be formed by heat treating the metal alloy layer 120. The etching mask patterns 125 may be formed by using a dewetting phenomenon through the heat treatment process. Herein, the term "dewetting phenomenon" denotes that a material having a dewetting behavior is formed in a non-uniform pattern having a concave or convex shape from a state of a film uniformly deposited on a surface. That is, random micropatterns may be formed by heat treating the metal alloy layer 120 to induce the dewetting phenomenon.

Shape, size, or spacing of the etching mask patterns 125 may be adjusted by varying composition and thickness of the metal alloy layer 120 or temperature and time of the heat treatment process. That is, when the metal alloy layer 120 is heat treated, a progression rate of the dewetting phenomenon in the metal alloy layer 120 may be lower than that in pure metal. Therefore, the etching mask patterns 125 may be more precisely formed in a desired shape.

For example, the etching mask patterns 125 may be formed in a droplet shape. A width w1 of the etching mask patterns 125 may be in a range of about 100 nm to about 1000 nm and a spacing L1 between the etching mask patterns 125 may be in a range of about 100 nm to about 3000 nm.

The heat treatment process may be performed by thermal annealing, rapid thermal annealing (RTA), oven heating, or hot-plate heating. The heat treatment process may be performed in a temperature range below a softening point of the substrate 100 or softening points of the light-scattering medium layer 110.

Figure 3:
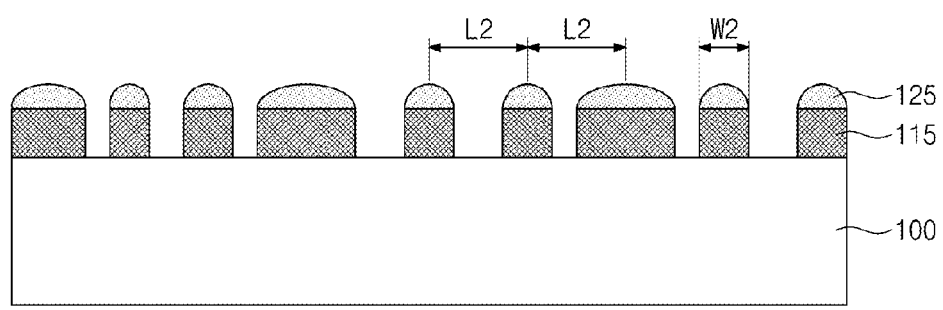

Referring to FIG. 3, the light-scattering medium layer 110 is etched to form a light scattering layer 115. The light-scattering layer 115 may be formed by dry etching or wet etching using the etching mask patterns 125 as an etch mask.

The dry etching may be performed by using an anisotropic etching method, such as reactive ion etching (RIE) or inductively coupled plasma (ICP) etching, and the wet etching may be performed by using an isotropic etching method, such as hydrofluoric acid or buffered oxide etchant (BOE) etching. The light-scattering layer 115 may be formed to have irregular shaped nanostructures through the etching process.

The nanostructures in the light-scattering layer 115 may be formed to have irregular width and spacing. The light-scattering layer 115 may be formed according to the width and spacing of the etching mask patterns 125. For example, a width w2 of the nanostructures in the light-scattering layer 115 may be in a range of about 100 nm to about 1000 nm and a spacing L2 between the nanostructures may be in a range of about 100 nm to about 3000 nm.

According to an embodiment of the present invention, a silicon oxide ($SiO_2$) layer may be disposed on the substrate 100 as the light-scattering medium layer 110. An Ag alloy layer may be disposed on the silicon oxide layer as the metal alloy layer 120 and thereafter, the etching mask patterns 125 may be formed by using a dewetting phenomenon through a heat treatment. The light-scattering layer 115 may be formed through a dry etching process employing reactive ion etching or inductively coupled plasma etching by using the etching mask patterns 125 as an etch mask. The light-scattering layer 115 formed by using the dry etching process is anisotropically etched and thus, nanostructures having rectangular cross sections may be formed.

The light-scattering layer 115 is formed and then the etching mask patterns 125 may be removed by an acid without destroying the light-scattering layer 115. The acid may include nitric acid ($HNO_3$), sulfuric acid ($H_2SO_4$), aqua regia, or phosphoric acid ($H_3PO_4$).

Figure 4:
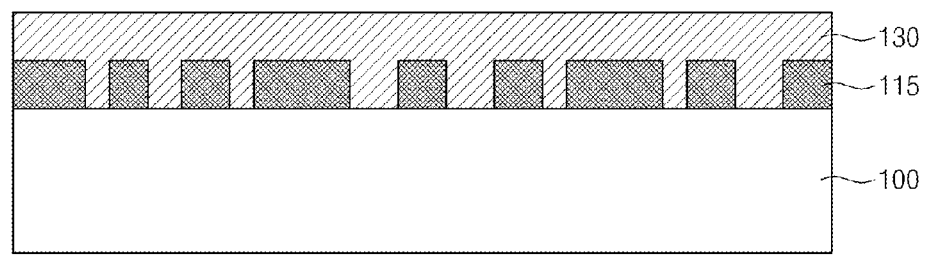

Referring to FIG. 4, a planarizing layer 130 is disposed on the light-scattering layer 115. The planarizing layer 130 may act to planarize an upper surface of the light-scattering layer 115 by being disposed on the light-scattering layer 115. Therefore, irregularities due to the nanostructures in the light-scattering layer 115 may be protected and an organic light emitting diode having electrical properties similar to those of an organic light emitting diode formed on the flat substrate 100 may be fabricated.

The planarizing layer 130 may be a transparent material. The planarizing layer 130 may be formed of a material having a high refractive index. A refractive index of the planarizing layer 130 may be similar to or higher than that of a conductor used as a first electrode. For example, the planarizing layer 130 may have a refractive index ranging from about 1.7 or more to about 2.5 or less. The larger the difference between the refractive index of the planarizing layer 130 and the refractive index of the light-scattering layer 115 is, the higher the light extraction efficiency may be. For example, the planarizing layer 130 may be formed of an inorganic material, such as $TiO_2$, $ZrO_2$, ZnS, $TiO_2$—$SiO_2$, $SnO_2$, and $In_2O_3$, or a composite of a polymer, such as a polyvinyl phenol resin, an epoxy resin, a polyimide resin, a polystyrene resin, a polycarbonate resin, a polyethylene resin, a poly(methyl methacrylate) (PMMA) resin, and a polypropylene resin, and the inorganic material.

The planarizing layer 130 may be formed by using a spin coating, dip coating, slit coating, bar coating, or spray coating method. A material for the planarizing layer 130 may be prepared in a liquid phase in order to use the foregoing coating methods. For example, the inorganic material may be prepared as a precursor by using a sol-gel method and the composite of the polymer and the inorganic material may be prepared in a liquid phase by adding a corresponding monomer or polymer after allowing nanoparticles to be dispersed in a solvent. Coating is performed by using the foregoing method and then the planarizing layer 130 may be formed by being cured through a heat treatment or ultraviolet irradiation.

The planarizing layer 130 may be formed by sputter deposition, chemical vapor deposition, E-beam evaporation, thermal evaporation, or atomic layer deposition.

According to another embodiment of the present invention, an inorganic light emitting diode including the light-scattering layer 115 may be prepared without the formation of the planarizing layer 130.

Figure 5:
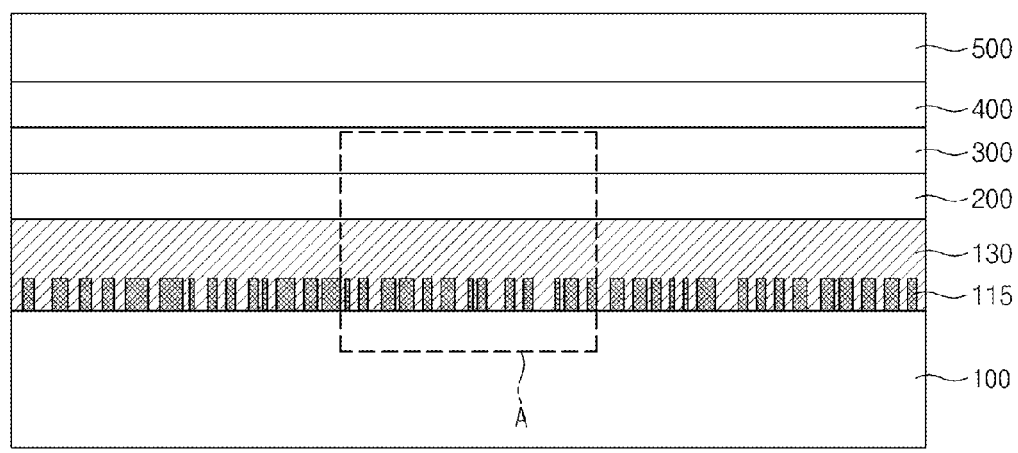

Referring to FIG. 5, a first electrode 200, an organic light-emitting layer 300, a second electrode 400, and a protective layer 500 may be sequentially formed on the planarizing layer 130.

The first electrode 200 may be a transparent conductive material. For example, the first electrode 200 may be a transparent conductive oxide (TCO). For example, the first electrode 200 may be indium tin oxide (ITO) or indium zinc oxide (IZO).

The organic light-emitting layer 300 may include at least one organic light-emitting material. For example, the organic light-emitting layer 300 may include at least any one of a polyfluorene derivative, a (poly)paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, or carbazole.

According to another embodiment of the present invention, the organic light-emitting layer 300 may be an organic light-emitting material including a dopant. For example, the organic light-emitting layer 300 may include at least any one of xanthene, perylene, cumarine, rhodamine, rubrene, dicyanomethylenepyran, thiopyran, (thia)pyrilium, a periflanthene derivative, an indenoperylene derivative, carbostyryl, Nile red, or quinacridone, as the dopant, and may include at least any one of a polyfluorene derivative, a (poly)paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, or carbazole, as the organic light-emitting material.

The organic light-emitting layer 300 may have a single-layer structure or a multilayer structure including an auxiliary layer. According to some embodiments of the present invention, an auxiliary layer increasing a luminous efficiency of the organic light-emitting layer 300 may be further included. The auxiliary layer may include at least one of a hole injecting layer, a hole transfer layer, an electron transfer layer, or an electron injecting layer. The organic light-emitting layer 300 may generate light through recombination of holes or electrons supplied from the first electrode 200 or the second electrode 400.

The second electrode 400 may be a material having conductivity. The second electrode 400 may be a metal or light-transmissible conductive material. For example, aluminum (Al), silver (Ag), magnesium (Mg), molybdenum (Mo), or an alloy thereof may be used as the metal. A thin film of the foregoing metal may be used as the light-transmissible conductive material for the second electrode 400. A wavelength of transmitted light may be different from a thickness of the thin film.

The second electrode 400 may be configured to supply electrons to the organic light-emitting layer 300 by having a voltage supplied from the outside. The second electrode 400 may transmit light generated from the organic light-emitting layer 300 or may reflect the light toward the first electrode 200.

The protective layer 500 may be formed of an air-impermeable material. The protective layer 500 may be a transparent material. The protective layer 500 may be configured to cover the organic light emitting diode.

Figure 6:
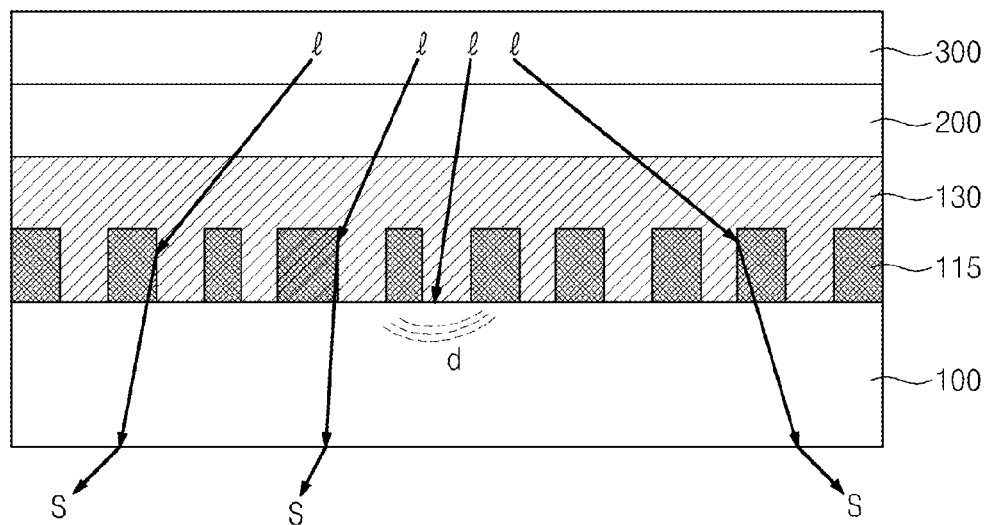
FIG. 6 is a cross-sectional view illustrating an enlarged portion of "A" in FIG. 5 to describe an aspect of the organic light emitting diode according to the embodiment of the present invention in more detail.

FIG. 6 is a cross-sectional view illustrating an enlarged portion of "A" in FIG. 5 to describe an aspect of the organic light emitting diode according to the embodiment of the present invention in more detail.

Referring to FIG. 6, light 1 generated from the organic light-emitting layer 300 may be incident on the substrate 100 through the first electrode 200.

The light 1 generated from the organic light-emitting layer 300 may be guided inside the first electrode 200 and the organic light-emitting layer 300 by partial reflection or total reflection from the substrate 100. The light guided inside may not be emitted outside the substrate 100.

With respect to a typical organic light emitting diode, light guided inside the first electrode 200 and the organic light-emitting layer 300 according to the difference between the refractive index of the first electrode 200 and the refractive index of the substrate 100 may be generated about 45% of total light emission amount.

However, according to embodiments of the present invention, partial reflection or total reflection of the light 1 incident on the substrate 100 may be decreased by the formation of the planarizing layer 130 and the light-scattering layer 115 on the substrate 100. Light guided inside the first electrode 200 among the light 1 incident on the substrate 100 may be decreased by means of the planarizing layer 130 having a refractive index similar to or greater than that of the first electrode 200. Also, the light 1 may be emitted to the outside of the substrate 100 instead of the inside of the first electrode 200 by being scattered, diffused reflected, and/or refracted s from the light-scattering layer 115 including the nanostructures. Therefore, a ratio of light emitted outside the substrate 100 to light reflected inside the first electrode 200 may increase. That is, the organic light emitting diode according to the present invention may have increased light extraction efficiency.

In addition, the light 1 incident on the substrate 100 may be diffracted by the nanostructures in the light-scattering layer 115. The diffracted light d may contribute to increase the light extraction efficiency of the organic light emitting diode according to the present invention by being emitted outside the substrate 100.

Also, the nanostructures in the light-scattering layer 115 have irregular width and spacing, and thus, may increase the light extraction efficiency of the organic light emitting diode because the nanostructures may scatter, diffused reflect, refract, and/or diffract entire incident light in a visible region without dependence on a specific wavelength.

Figure 7:
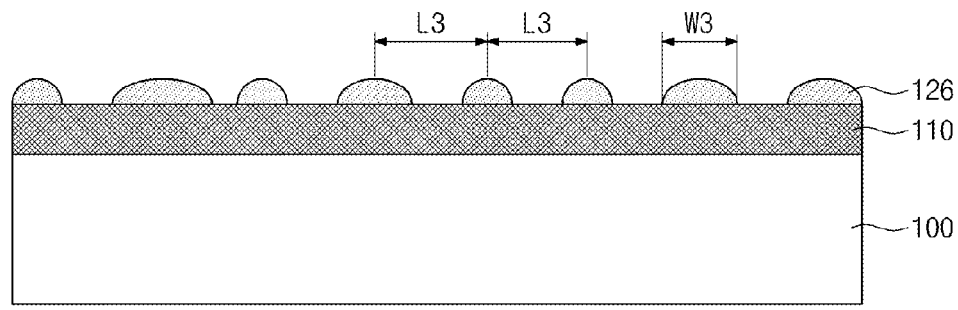
FIGS. 7 through 9 are cross-sectional views illustrating a structure of an organic light emitting diode according to another embodiment of the present invention and a method of fabricating the same.
Figure 8:
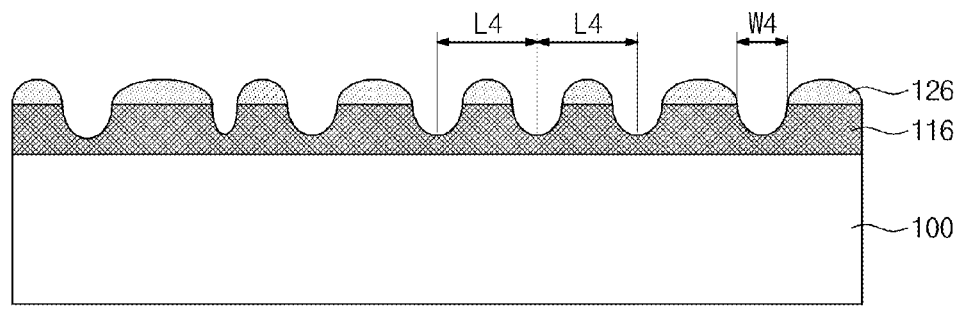
Figure 9:
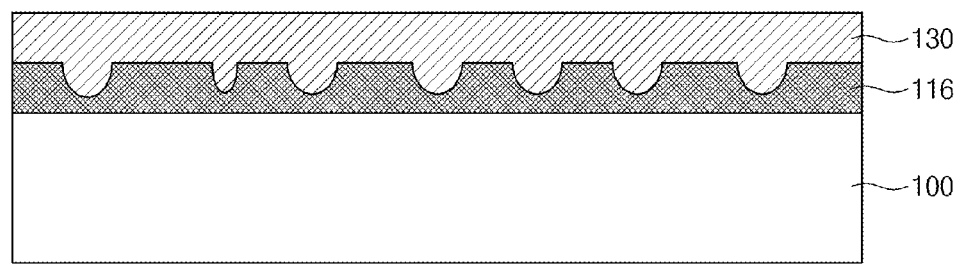

FIGS. 7 through 9 are cross-sectional views illustrating a structure of an organic light emitting diode according to another embodiment of the present invention and a method of fabricating the same.

Referring to FIG. 7, the light-scattering medium layer 110 and the etching mask patterns 126 are sequentially formed on the substrate 100 as described in FIGS. 1 and 2. The etching mask patterns 126 may be formed by heat treating the metal alloy layer 120. The etching mask patterns 126 may be formed by using a dewetting phenomenon through the heat treatment process.

The etching mask patterns 126 may be formed of an array of metal particles or a porous metal layer. The etching mask patterns 126 may be formed to have irregular width and spacing. For example, a width w3 of the etching mask patterns 126 formed of the metal particle array may be in a range of about 50 nm to about 500 nm and a spacing L3 between the etching mask patterns 126 may be in a range of about 150 nm to about 1500 nm. A width w3 of a hole of the etching mask patterns 126 formed of the porous metal layer may be in a range of about 20 nm to about 200 nm and a spacing L3 between the holes may be in a range of about 150 nm to about 1500 nm.

The heat treatment process may be performed by thermal annealing, rapid thermal annealing, oven heating, or hot-plate heating. The heat treatment process may be performed in a temperature range below a softening point of the substrate 100 or softening points of the light-scattering medium layer 110.

Referring to FIG. 8, the light-scattering medium layer 110 is etched to form a light scattering layer 116. The light-scattering layer 116 may be formed by dry etching or wet etching using the etching mask patterns 126 as an etch mask.

According to an embodiment of the present invention, a silicon oxide layer may be disposed on the substrate 100 as the light-scattering medium layer 110. An Ag alloy layer may be disposed on the silicon oxide layer as the metal alloy layer 120, and thereafter, the etching mask patterns 126 may be formed by using a dewetting phenomenon through a heat treatment. The light-scattering layer 116 may be formed by a wet etching process employing buffered oxide etchant etching using the etching mask patterns 126 as an etch mask. When the wet etching process is performed, the light-scattering layer 116 is isotropically etched and thus, nanostructures having round concave cross sections may be formed.

The nanostructures in the light-scattering layer 116 may be formed to have irregular width and spacing. The light-scattering layer 116 may be formed according to width and spacing of the etching mask patterns 126. For example, a width w4 of the nanostructures in the light-scattering layer 116 may be in a range of about 100 nm to about 1000 nm and a spacing L4 between the nanostructures may be in a range of about 100 nm to about 3000 nm.

The light-scattering layer 116 is formed and then the etching mask patterns 126 may be removed by an acid without destroying the light-scattering layer 116. The acid may include nitric acid, sulfuric acid, aqua regia, or phosphoric acid.

Referring to FIG. 9, the planarizing layer 130 is disposed on the light-scattering layer 116 as described in FIG. 4. Thereafter, the first electrode, the organic light-emitting layer, the second electrode, and the protective layer may be sequentially formed on a product including the substrate 100, the light-scattering layer 116, and the planarizing layer 130. (see FIG. 5)

According to another embodiment of the present invention, an inorganic light emitting diode including the light-scattering layer 116 may be prepared without the formation of the planarizing layer 130.

Figure 10:
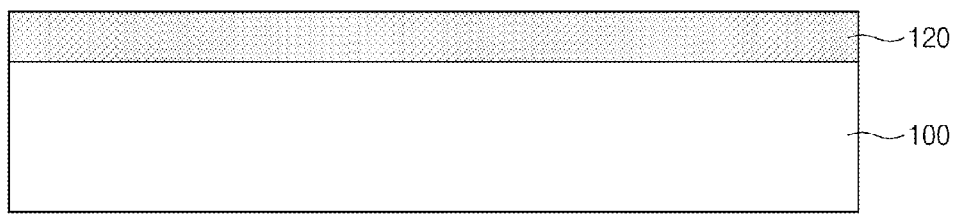
FIGS. 10 through 12 are cross-sectional views illustrating a structure of an organic light emitting diode according to another embodiment of the present invention and a method of fabricating the same.
Figure 11:
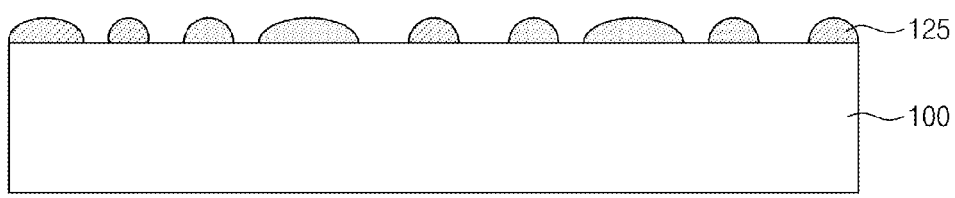
Figure 12:
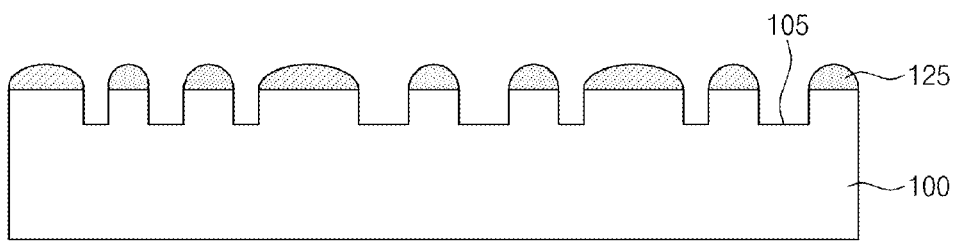

FIGS. 10 through 12 are cross-sectional views illustrating a structure of an organic light emitting diode according to another embodiment of the present invention and a method of fabricating the same.

Referring to FIG. 10, the metal alloy layer 120 is formed on a surface of the substrate 100 without the formation of the light-scattering layer. Thereafter, as shown in FIG. 11, the etching mask patterns 125 may be formed by heat treating the metal alloy layer 120. The etching mask patterns 125 may be formed by using a dewetting phenomenon through the heat treatment process.

The heat treatment process may be performed by thermal annealing, rapid thermal annealing, oven heating, or hot-plate heating. The heat treatment process may be performed in a temperature range below a softening point of the substrate 100 or softening points of the light-scattering medium layer 110 and the substrate 100.

Referring to FIG. 12, light-scattering patterns 105 are formed on the substrate 100. The light-scattering patterns 105 may be formed by etching the upper surface of the substrate 100 by using the etching mask patterns 125 as an etch mask.

For example, the etching process may be a dry etching process employing reactive ion etching or inductively coupled plasma etching. A surface of the substrate 100 formed by using the dry etching process is anisotropically etched and thus, the light-scattering patterns 105 including nanostructures having rectangular cross sections may be formed at an upper portion of the substrate 100.

The light-scattering patterns 105 of the substrate 100 may be formed to have irregular width and spacing. The light-scattering patterns 105 may be formed according to width and spacing of the etching mask patterns 125. For example, a width of the light-scattering patterns 105 may be in a range of about 100 nm to about 1000 nm and a spacing between the nanostructures may be in a range of about 100 nm to about 3000 nm.

The light-scattering patterns 105 may exhibit a light-scattering effect similar to that of the light-scattering layer (see 115 of FIG. 5) formed by etching the light-scattering medium layer.

The light-scattering patterns 105 are formed and then the etching mask patterns 125 may be removed by an acid without destroying the light-scattering patterns 105. The acid may include nitric acid, sulfuric acid, aqua regia, or phosphoric acid.

An organic light emitting diode according to the present invention includes a light-scattering layer including nanostructures having an irregular uneven shape. Light emitted from an organic light-emitting layer may scatter, diffused reflect, refract, or diffract by the light-scattering layer. A possibility that the light scattered, diffused reflected, refracted, or diffracted by the light-scattering layer is emitted outside the substrate increases in comparison to the case of a flat substrate without a light-scattering layer. As a result, the organic light emitting diode according to the present invention may improve technical difficulties such as total reflection decreasing light extraction efficiency. Also, when a light-scattering medium layer is used, the light extraction efficiency may be more effectively increased by maximizing a light-scattering effect through optimization of its difference in refractive index with the substrate or a planarizing layer, in comparison to the case of directly forming a nanostructure scattering layer on the substrate without the light-scattering medium layer.

A method of fabricating an organic light emitting diode according to the present invention provides a method of preparing a light-scattering layer and etching mask patterns for preparing the light-scattering layer. Since lower manufacturing costs and simpler process may be possible in comparison to a typical fabrication method, the organic light emitting diode according to the present invention may be mass produced at a low cost.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating an organic light emitting diode, the method comprising:

sequentially stacking a light-scattering medium layer and a metal alloy layer on a substrate;

heat treating the metal alloy layer to form etching mask patterns;

etching the light-scattering medium layer by using the etching mask patterns to form a light-scattering layer; and removing the etching mask patterns.

2. The method of claim 1, wherein the light-scattering medium layer includes at least one of $SiO_2$, $SnO_2$, $TiO_2$, $TiO_2$—$SiO_2$, $ZrO_2$, $Al_2O_3$, $HfO_2$, $In_2O_3$, ITO (indium tin oxide), metal nitride, a polyethylene-based resin, a polyacryl-based resin, a PVC (polyvinyl chloride) resin, PVP (polyvinylpyrrolidone), a polyimide-based resin, a polystyrene-based resin, or an epoxy-based resin.

3. The method of claim 1, wherein the light-scattering medium layer has a refractive index higher than that of the substrate.

4. The method of claim 1, wherein the light-scattering medium layer has a refractive index lower than that of the substrate.

5. The method of claim 1, wherein the light-scattering medium layer has a thickness ranging from about 50 nm to about 1000 nm.

6. The method of claim 1, wherein the metal alloy layer includes Ag (silver), Au (gold), Cu (copper), Pt (platinum), Ni (nickel), Cr (chromium), Pd (palladium), Mg (magnesium), Cs (cesium), Ca (calcium), Sn (tin), Sb (antimony), Pb (lead), or a combination thereof.

7. The method of claim 1, wherein the metal alloy layer has a thickness ranging from about 5 nm to about 300 nm.

8. The method of claim 1, wherein a width of the etching mask patterns is in a range of about 50 nm to about 1000 nm and a spacing between the etching mask patterns is in a range of about 100 nm to about 3000 nm.

9. The method of claim 1, wherein the forming of the light-scattering layer comprises dry etching or wet etching the light-scattering medium layer, wherein the dry etching comprises RIE (reactive ion etching) or ICP (inductively coupled plasma) etching and the wet etching comprises hydrofluoric acid or BOE (buffered oxide etchant) etching.

10. The method of claim 1, wherein the light-scattering layer comprises nanostructures having an irregular uneven shape.

11. The method of claim 10, wherein a width of the nanostructures is in a range of about 100 nm to about 1000 nm and a spacing between the nanostructures is in a range of about 100 nm to about 3000 nm.

12. The method of claim 1, further comprising forming a planarizing layer on the light-scattering layer.

13. The method of claim 12, wherein the planarizing layer has a refractive index different from that of the light-scattering layer.

14. The method of claim 12, wherein the planarizing layer has a refractive index equal to or higher than that of the first electrode.

* * * * *